United States Patent
Bae et al.

(10) Patent No.: US 7,727,884 B2
(45) Date of Patent: Jun. 1, 2010

(54) METHODS OF FORMING A SEMICONDUCTOR DEVICE INCLUDING A PHASE CHANGE MATERIAL LAYER

(75) Inventors: Byoung-Jae Bae, Hwasung-si (KR); Sung-Lae Cho, Yongin-si (KR); Jin-Il Lee, Sungnam-si (KR); Hye-Young Park, Sungnam-si (KR); Ji-Eun Lim, Yongin-si (KR); Young-Lim Park, Ahnyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 99 days.

(21) Appl. No.: 11/779,885

(22) Filed: Jul. 19, 2007

(65) Prior Publication Data

US 2008/0020564 A1    Jan. 24, 2008

(30) Foreign Application Priority Data

Jul. 19, 2006   (KR)   ...................... 10-2006-0067514

(51) Int. Cl.
H01L 21/4763   (2006.01)
(52) U.S. Cl. ................ 438/631; 438/597; 438/622; 438/257; 438/258; 438/386; 257/3; 257/301; 257/E45.002; 257/E21.476
(58) Field of Classification Search ................ 438/784, 438/597, 652, 631, 622, 257, 258, 385; 500/117; 257/3, 301, E45.002, E21.476
See application file for complete search history.

(56) References Cited

U.S. PATENT DOCUMENTS

| 5,403,620 | A | 4/1995 | Kaesz et al. |
| 5,681,975 | A | 10/1997 | Brennan et al. |
| 6,984,591 | B1 | 1/2006 | Buchanan et al. |
| 7,141,488 | B2 * | 11/2006 | Woelk et al. ................. 438/478 |
| 7,420,200 | B2 * | 9/2008 | Karpov .......................... 257/3 |
| 2005/0113243 | A1 * | 5/2005 | Thorn et al. ................. 502/117 |
| 2005/0181632 | A1 * | 8/2005 | Tan et al. ..................... 438/784 |
| 2006/0040485 | A1 * | 2/2006 | Lee et al. ..................... 438/597 |
| 2006/0094236 | A1 * | 5/2006 | Elkins et al. ................. 438/652 |

FOREIGN PATENT DOCUMENTS

| KR | 1020060008027 A | 1/2006 |
| KR | 1020060074236 A | 7/2006 |
| KR | 1020060076262 A | 7/2006 |
| WO | WO0227063 | 4/2002 |

* cited by examiner

*Primary Examiner*—William M Brewster
*Assistant Examiner*—Wilner Jean Baptiste
(74) *Attorney, Agent, or Firm*—Volentine & Whitt, PLLC

(57) ABSTRACT

A method includes forming a phase change material layer on a substrate using a deposition process that employs a process gas. The process gas includes a germanium source gas, and the germanium source gas includes at least one of the atomic groups "—N=C=O", "—N=C=S", "—N=C=Se", "—N=C=Te", "—N=C=Po" and "—C≡N".

20 Claims, 5 Drawing Sheets

METHODS OF FORMING A SEMICONDUCTOR DEVICE INCLUDING A PHASE CHANGE MATERIAL LAYER

CROSS-REFERENCE TO RELATED APPLICATION(S)

A claim of priority is made to Korean Patent Application No. 10-2006-67514, filed Jul. 19, 2006, the disclosure of which is hereby incorporated herein by reference in its entirety.

BACKGROUND OF THE INVENTION

1. Field of the Invention

The present invention relates to methods of forming a semiconductor device and, more particularly, to methods of forming a semiconductor device including a phase change material layer.

2. Description of the Related Art

Phase change memory devices are non-volatile memory devices that employ a phase change material as a data storage element. The phase change material has two stable states which exhibit different resistive characteristics, for example either an amorphous state or a crystalline state. If the phase change material is heated to a temperature higher than the melting point thereof and quenched down rapidly, the phase change material may become the amorphous state. In contrast, if the phase change material is heated to a temperature within the range of the melting point to a crystallization temperature thereof and cooled down slowly, the phase change material may become the crystalline state. Accordingly, the phase change material may be used as a data storage element to program a logic data "0" or a logic data "1", and the data stored in the phase change material can be read out by applying a predetermined voltage to the phase change material and sensing a current that passing therethrough.

Joule heat is used to change the crystalline structure of the phase change material. The joule heat may be generated by forcing a heating current into a conductive heater which is connected to the phase change material, and the resultant joule heat is thermally conducted to the phase change material. The temperature of the phase change material depends on the amount of the heating current. In general, at least several milli-amperes may be required to change the crystalline structure of the phase change material. Thus, there may be some limitations in improving the integration density of the phase change memory device and in reducing the power consumption thereof.

As the semiconductor devices such as phase change memory devices become more highly integrated, methods for reducing heating current are continuously explored. Recently, a method of forming the phase change material in a confined space (for example, a hole, etc.) has been proposed in order to reduce the heating current. If the phase change material is formed in the confined space, a contact area between the phase change material and the conductive heater can be decreased to reduce the heating current that is required to change the crystalline structure of the phase change material.

The phase change material may be deposited using a sputtering technique. In this case, the phase change material may not completely fill the confined space such as the hole since the sputtering technique exhibits poor step coverage. Thus, a chemical vapor deposition (CVD) technique has recently been proposed to form the phase change material layer such as a GST (Ge—Sb—Te) layer. However, in the event that the phase change material layer is formed using the CVD technique that employs source gases which are well known in the art, some problems may occur. For example, when the GST layer is formed using the CVD technique, a $GeH_4$ gas or a $Ge(allyl)_4$ gas may be widely used as the source gas and the $GeH_4$ gas or the $Ge(allyl)_4$ gas is decomposed at a temperature of about 400° C. Accordingly, the CVD process using the $GeH_4$ gas or the $Ge(allyl)_4$ gas as a source gas should be performed at a temperature of 400° C. or the higher. However, the GST layer may begin to volatilize at a temperature of about 350° C. Thus, the GST layer may volatilize during deposition of the GST layer using the conventional CVD technique that employs the $GeH_4$ gas or the $Ge(allyl)_4$ gas as a source gas. As a result, the conventional CVD GST layer may be discontinuously and/or non-uniformly formed to degrade characteristics of the phase change memory device.

SUMMARY OF THE INVENTION

In one aspect, a method of forming a semiconductor device is provided. The method includes forming a phase change material layer on a semiconductor substrate using a deposition process that employs a process gas. The process gas comprises a germanium source gas, and the germanium source gas comprises at least one atomic group selected from the group consisting of "—N=C=O", "—N=C=S", "—N=C=Se", "—N=C=Te", "—N=C=Po" and "—C≡N".

The germanium source gas may, for example, have a chemical formula $X^1X^2X^3GeY$. In the chemical formula, each of "$X^1$", "$X^2$" and "$X^3$" may independently be one of a saturated alkyl group ($C_nH_{2n+1}$; where, $0 \leq n \leq 10$), an olefinic alkyl group ($C_nH_{2n-1}$; where, $1 \leq n \leq 12$), an acetylenic alkyl group ($C_nH_{2n-3}$; where, $2 \leq n \leq 13$), an allenic alkyl group (—CH=C=CH2), —$NR^1R^2$ (where, "$R^1$" and "$R^2$" are alkyl groups), —$N_3$, —N=C=O, —N=C=S, —N=C=Se, —N=C=Te, —N=C=Po, —C≡N and a combination thereof. "Y" may include at least one selected from the group consisting of "—N=C=O", "—N=C=S", "—N=C=Se", "—N=C=Te", "—N=C=Po" and "—C≡N". Each of "$R^1$" and "$R^2$" may be one of a saturated alkyl group ($C_nH_{2n+1}$; where, $0 \leq n \leq 10$), an olefinic alkyl group ($C_nH_{2n-1}$; where, $1 \leq n \leq 12$), an acetylenic alkyl group ($C_nH_{2n-3}$; where, $2 \leq n \leq 13$) and an allenic alkyl group (—CH=C=CH2). In addition, at least two of the "$X^1$", "$X^2$" and "$X^3$" may be bound by chemical bond.

When the germanium source gas includes an atomic group "—C≡N", the process gas may further include an auxiliary reaction gas containing at least one selected from the group consisting of oxygen (O), sulfur (S), selenium (Se), tellurium (Te) and polonium (Po).

The deposition process may, for example, be performed at a process temperature of substantially about 25° C. to about 330° C.

Before forming the phase change material layer, the method may further include forming an interlayer insulating layer on the semiconductor substrate, and patterning the interlayer insulating layer to form a hole. In this case, the phase change material layer may be formed to fill at least a portion of the hole. In addition, the method may further include forming a lower conductive pattern that fills a lower portion of the hole. In this case, the phase change material layer may be formed to fill the hole on the lower conductive pattern. Moreover, the method may further include planarizing the phase change material layer to form a phase change material pattern in the hole, and forming an upper conductive pattern on the interlayer insulating layer. The planarization of the phase change material layer may be performed until a top surface of the insulating layer is exposed, and the upper conductive pattern may be formed to cover a top surface of the phase change material pattern.

The phase change material layer may, for example, be formed of at least one selected from the group consisting of Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge,Sn)—Sb—Te, Ge—Sb—(Se,Te), Ge—Sb—In, Ge—Sb—Te—S and any of these compounds containing impurities therein, where the impurities are at least one selected from the group consisting of nitrogen (N), oxygen (O), bismuth (Bi), stannum (Sn), boron (B) and silicon (Si).

The formation of the phase change material layer may include loading the semiconductor substrate into a process chamber, injecting plural kinds of source gases into the process chamber to form a phase change material layer on the semiconductor substrate, and unloading the semiconductor substrate having the phase change material layer from the process chamber. In this case, the process gas may include the plural kinds of source gases, and one of the source gases may be the germanium source gas. Further, the plural kinds of source gases may be simultaneously injected into the process chamber to form the phase change material layer. In addition, the process gas may further include an impurity gas including at least one selected from the group consisting of nitrogen (N), oxygen (O), bismuth (Bi), stannum (Sn), boron (B) and silicon (Si). The impurity gas and the plural kinds of source gases may be simultaneously injected into the process chamber.

The method may include sequentially injecting a plurality of supply gases into the process chamber to form the phase change material layer, wherein each of the supply gases includes at least one of the plural kinds of source gases. The process gas may further include an impurity gas including at least one selected from the group consisting of nitrogen (N), oxygen (O), bismuth (Bi), stannum (Sn), boron (B) and silicon (Si). The impurity gas and the plurality of supply gases may be sequentially injected into the process chamber. Alternately, the impurity gas may be simultaneously injected with one of the supply gases. The process chamber may be purged after injection of each of the supply gases.

The germanium source gas may be injected into the process chamber together with a carrier gas. The carrier gas may be an inert gas.

BRIEF DESCRIPTION OF THE DRAWINGS

The above and other aspect and features of the disclosed embodiments will become readily apparent from the detailed description that follows, with reference to the accompanying drawings, in which.

DETAILED DESCRIPTION OF EMBODIMENTS

Figure 1:
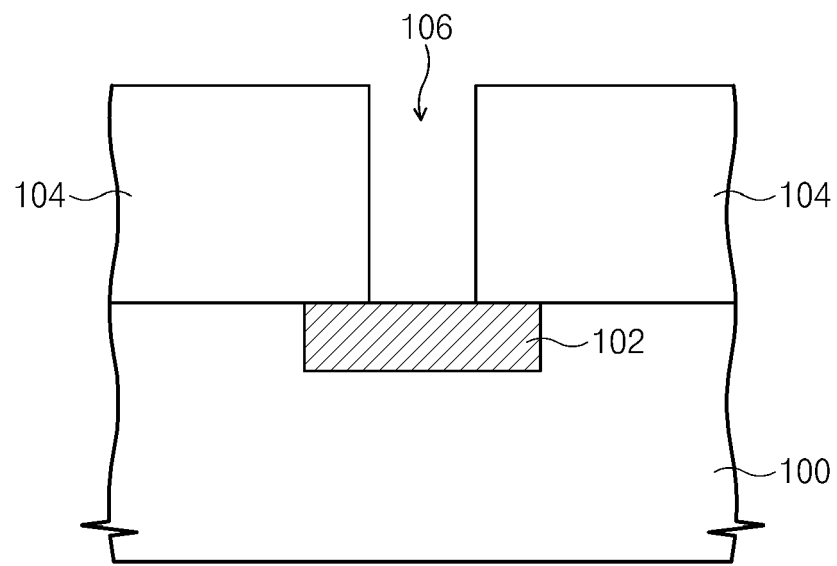
FIGS. 1 to 4 are cross sectional views for describing a method of forming a semiconductor device including a phase change material layer according to an exemplary embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer (or a film) is referred to as being "on" another layer (or a film) or substrate, it can be directly on the other layer (or film) or substrate, or intervening layers (or films) may be present. Like numbers refer to like elements throughout the specification.

FIGS. 1 to 4 are cross sectional views illustrating an example of a method of forming a semiconductor device including a phase change material layer according to an embodiment of the present invention.

Referring to FIG. 1, an interlayer insulating layer 104 is formed on a semiconductor substrate 100 having a conductive region 102. The conductive region 102 may, for example, be one or more selected from the group consisting of a doped polysilicon layer, a metal layer (for example, a tungsten layer), a conductive metal nitride layer (for example, a titanium nitride layer, a titanium aluminum nitride layer or a titanium silicon nitride layer) and a metal silicide layer (for example, a tungsten silicide layer). Alternatively, the conductive region 102 may be an impurity-doped region which is doped with n-type dopants or p-type dopants.

The interlayer insulating layer 104 may, for example, be formed of a silicon oxide layer. As shown in FIG. 1, the interlayer insulating layer 104 is patterned to form a hole 106 which exposes the conductive region 102.

Figure 2:
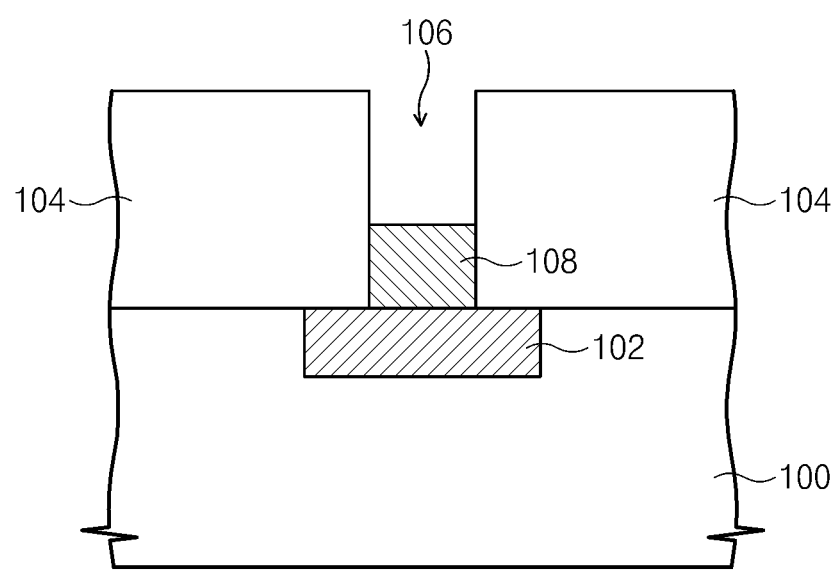

Referring to FIG. 2, a first conductive layer is formed to fill the hole 106, and the first conductive layer is planarized until the interlayer insulating layer 104 is exposed. The planarized first conductive layer is recessed to form a lower conductive pattern 108 that fills a lower portion of the hole 106. In this example, the upper portion of hole 106 located over the lower conductive pattern 108 is unfilled. The lower conductive pattern 108 may, for example, be formed of one or more selected from the group consisting of doped silicon, titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and tantalum oxynitride (TaON).

Figure 3:
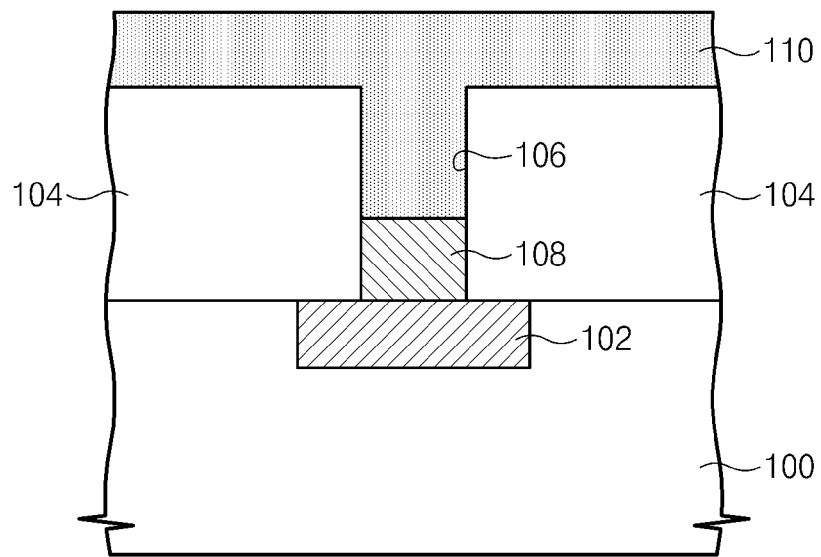

Referring to FIG. 3, a phase change material layer 110 is formed on an entire surface of the substrate having the lower conductive pattern 108. The phase change material layer 110 may be formed using a deposition process that employs a process gas. In this case, the process gas comprises a germanium source gas. Accordingly, the phase change material layer 110 may be formed to contain germanium (Ge). The phase change material layer 110 may be formed on the lower conductive pattern 108 so as to fill the upper portion of the hole 106. However, the embodiment is not limited in this respect. For example, in the event that the process for forming the lower conductive pattern 108 is omitted, the phase change material layer 110 may be formed to fill the entirety of the hole 106.

The germanium source gas may comprise various kinds of atomic groups. For example, the germanium source gas may comprise at least one atomic group selected from the group consisting of —N=C=O, —N=C=S, —N=C=Se, —N=C=Te, —N=C=Po and —C≡N. In more detail, the germanium source gas may, for example, have the following chemical formula 1.

$$X^1X^2X^3GeY \quad \text{(chemical formula 1)}$$

In the chemical formula 1, each of "$X^1$", "$X^2$" and "$X^3$" may independently be one of a saturated alkyl group ($C_nH_{2n+1}$; where, $0 \leq n \leq 10$), an olefinic alkyl group ($C_nH_{2n-1}$; where, $1 \leq n \leq 12$), an acetylenic alkyl group ($C_nH_{2n-3}$; where, $2 \leq n \leq 13$), an allenic alkyl group (—CH=C=CH2), —NR$^1$R$^2$ (where, "R$^1$" and "R$^2$" are alkyl groups), —N$_3$, —N=C=O, —N=C=S, —N=C=Se, —N=C=Te, —N=C=Po, —C≡N and a combination thereof. In the forgoing sentence and later herein, "independently" means that "$X^1$", "$X^2$" and "$X^3$" may be the same as each other or different from one another. Further, "Y" may include at least one atomic group selected from the group consisting of —N=C=O, —N=C=S, —N=C=Se, —N=C=Te, —N=C=Po and —C≡N.

In particular, each of "R$^1$" and "R$^2$" may independently be one of a saturated alkyl group ($C_nH_{2n+1}$; where, $0 \leq n \leq 10$), an olefinic alkyl group ($C_nH_{2n-1}$; where, $1 \leq n \leq 12$), an acetylenic alkyl group ($C_nH_{2n-3}$; where, $2 \leq n \leq 13$) and an allenic alkyl group (—CH=C=CH2).

At least two of the "$X^1$", "$X^2$" and "$X^3$" may be bound by a chemical bond. Also, as suggested above, "$X^1$", "$X^2$" and "$X^3$" may be the same atomic group. In another embodiment, the "$X^1$", "$X^2$" and "$X^3$" may be different atomic groups from one another. In yet another embodiment, two of the "$X^1$", "$X^2$" and "$X^3$" may be the same atomic group. In yet still another embodiment, the "$X^1$", "$X^2$", "$X^3$" and "Y" may be the same atomic group.

At least one of the atomic groups "—N=C=O", "—N=C=S", "—N=C=Se", "—N=C=Te", "—N=C=Po" and "—C≡N", which can be contained in the germanium source gas, may exhibit high reactivity. Thus, the germanium source gas may be easily decomposed at a low temperature. For example, the germanium source gas may be decomposed at a temperature within the range of about 25° C. to 330° C. Preferably, the germanium source gas may be decomposed at a temperature of 300° C. or lower.

The phase change material layer 110 may be formed of at least one selected from the group consisting of Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge,Sn)—Sb—Te, Ge—Sb—(Se,Te), Ge—Sb—In, Ge—Sb—Te—S and any of the afore-listed compounds containing impurities therein. The impurities may includes at least one selected from the group consisting of nitrogen (N), oxygen (O), bismuth (Bi), stannum (Sn), boron (B) and silicon (Si).

The deposition process for forming the phase change material layer 110) may be a chemical vapor deposition (CVD) process or an atomic layer deposition (ALD) process.

Figure 5:
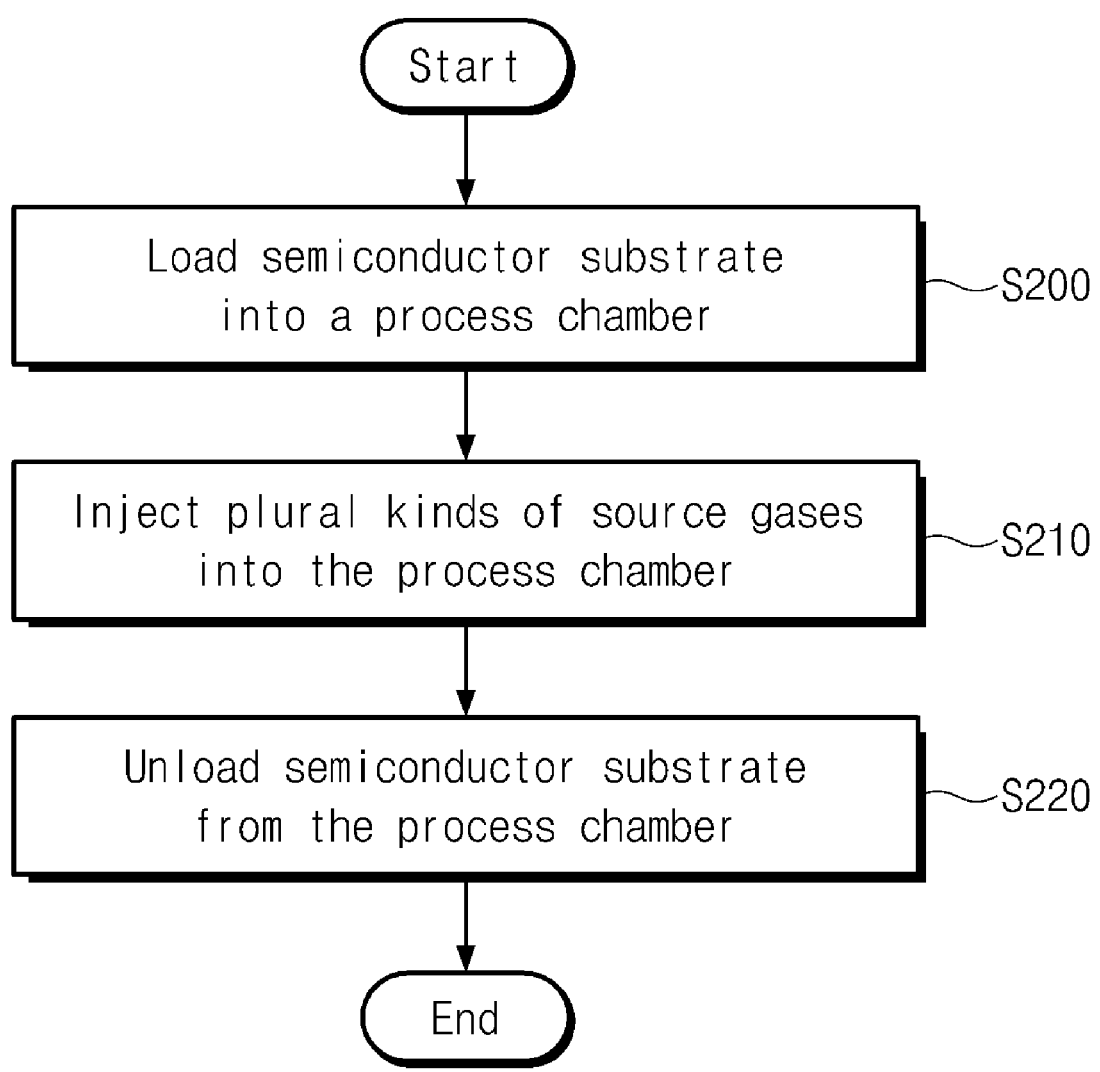
FIG. 5 is a flowchart illustrating a method of forming a phase change material layer according to an exemplary embodiment of the present invention.

FIG. 5 is a flowchart illustrating a method of forming the phase change material layer using a CVD process.

Referring to FIGS. 3 and 5, the semiconductor substrate 100 having the lower conductive pattern 108 is loaded into a process chamber (step S200). Plural kinds of source gases are then injected into the process chamber to form the phase change material layer 110 (step S210).

For example, all the plural kinds of source gases may be simultaneously injected into the process chamber. In this case, all the source gases simultaneously exist on the semiconductor substrate 100 having the lower conductive pattern 108 inside the process chamber.

When the phase change material layer 110 is formed using the CVD process, the CVD process temperature may be substantially within the range of about 25° C. to 330° C. More preferably, the CVD process temperature may be 300° C. or the lower. A process pressure in the process chamber may be about 1 Torr to 5 Torr during the CVD process.

One of the plural kinds of source gases may be a germanium source gas. When the phase change material layer 110 is a binary compound, the plural kinds of source gases may be two source gases. In this case, one of the two source gases contains one element of the phase change material layer and the other source gas contains the other element of the phase change material layer. Similarly, when the phase change material layer 110 is a ternary compound, the plural kinds of source gases may be three source gases which contain three different elements of the phase change material layer, respectively. Further, when the phase change material layer 110 is a quaternary compound, the plural kinds of source gases may be four source gases which contain four different elements of the phase change material layer, respectively.

In the event that the germanium source gas contains the atomic group "—C≡N", the process gas may further comprise an auxiliary reaction gas. The auxiliary reaction gas may comprise at least one selected from the group consisting of oxygen (O), sulfur (S), selenium (Se), tellurium (Te) and polonium (Po). The auxiliary reaction gas may react with the atomic group "—C≡N" to convert into one of "—N=C=O", "—N=C=S", "—N=C=Se", "—N=C=Te" and "—N=C=Po". Accordingly, the germanium source gas may comprise one of "—N=C=O", "—N=C=S", "—N=C=Se", "—N=C=Te" and "—N=C=Po". The CVD process may, however, be performed without use of the auxiliary reaction gas.

When the phase change material layer 110 is a compound containing impurities, an impurity gas may be further injected in addition to the source gases. The impurity gas may be a gas containing at least one selected from the group consisting of nitrogen (N), oxygen (O), bismuth (Bi), stannum (Sn), boron (B) and silicon (Si). For example, the impurity gas may include at least one selected from the group consisting of a hydrogen (H) gas, an ammonia (NH$_3$) gas, a N$_2$H$_4$ gas, a silane (SiH$_4$) gas, a diborane (B$_2$H$_6$) gas, an oxygen (O$_2$) gas, an ozone (O$_3$) gas and a water (H$_2$O) vapor gas. The impurity gas may be added to the process gas.

The process gas may further comprise a carrier gas that carries the plural kinds of source gases. The carrier gas may include at least one of an inert gas. For example, the carrier gas may include at least one selected from the group consisting of an argon (Ar) gas, a nitrogen (N$_2$) gas and a helium (He) gas.

By-product generated in the process chamber may be exhausted after deposition of the phase change material layer 110. The semiconductor substrate 100 having the phase change material layer 110 is then unloaded from the process chamber (a step S220).

Figure 6:
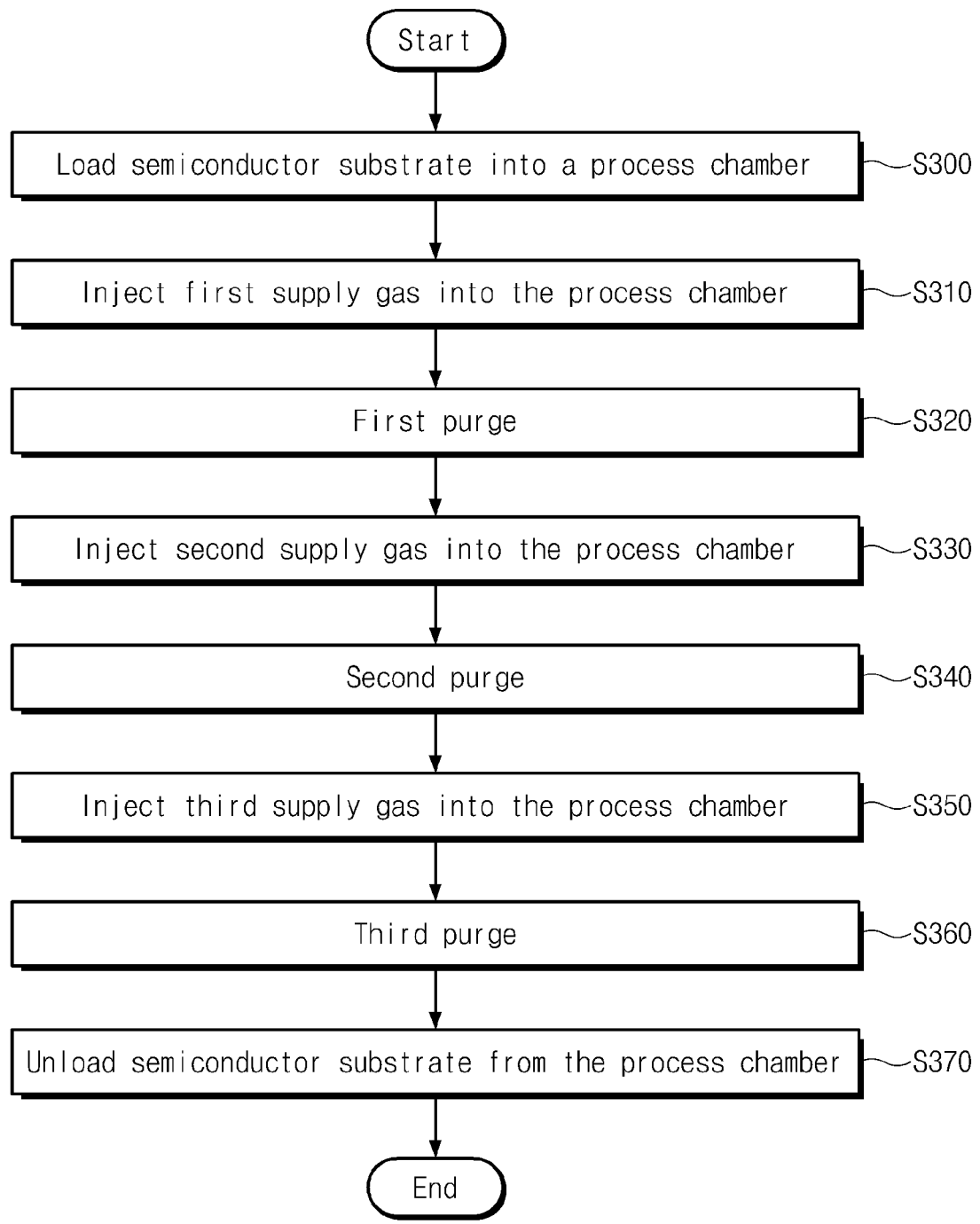
FIG. 6 is a flowchart illustrating a method of forming a phase change material layer according to another exemplary embodiment of the present invention.

FIG. 6 is a flowchart illustrating another method of forming the phase change material layer using an ALD process.

Referring to FIGS. 3 and 6, a process gas used in the ALD process may comprise plural kinds of source gases. One of the plural kinds of source gases is the aforementioned germanium source gas. The plural kinds of source gases may be classified into a plurality of supply gases. Each of the supply gases may comprise at least one of the plural kinds of source gases. In this embodiment, it is assumed that the source gases comprise first, second and third source gases, and each of the supply gases comprise one source gas. That is, the first, second and third supply gases comprise a first source gas, a second source gas and a third source gas, respectively. One of the first, second and third source gases is the germanium source gas.

The semiconductor substrate 100 having the lower conductive pattern 108 may be loaded into a process chamber (step S300). The first supply gas may be injected into the process chamber to adsorb the first source gas in the first supply gas onto the surface of the semiconductor substrate 100 having the lower conductive pattern 108 (a step S310). The first supply gas may be injected into the process chamber together with a first carrier gas. The first carrier gas is an inert gas such as an argon (Ar) gas, a nitrogen ($N_2$) gas or a helium (He) gas.

After injection of the first supply gas, a first purge process is performed in the process chamber (step S320). Non-absorbed source gas in the first supply gas is exhausted from the process chamber by the first purge process. The first purge process may be performed using a purge gas, and the purge gas may be an inert gas such as an argon (Ar) gas, a nitrogen ($N_2$) gas or a helium (He) gas.

The second supply gas is injected into the process chamber to adsorb the second source gas in the second supply gas onto the surface of the semiconductor substrate 100 (step S330). In this case, the second source gas may react on the adsorbed first source gas to produce a first by-product. The second source gas may be injected into the process chamber together with a second carrier gas. The second carrier gas is an inert gas such as an argon (Ar) gas, a nitrogen ($N_2$) gas or a helium (He) gas.

Any gases (for example, non-absorbed source gas in the second supply gas) and/or the first by-product remaining in the process chamber are then exhausted by a second purge process after injection of the second supply gas (step S340). The second purge process may be performed using a purge gas, and the purge gas may be an inert gas such as an argon (Ar) gas, a nitrogen ($N_2$) gas or a helium (He) gas.

The third supply gas is injected into the process chamber (step S350). The third source gas in the third supply gas are bonded with the adsorbed first and second source gases, thereby forming the phase change material layer 110. A second by-product may be produced in the process chamber during formation of the phase change material layer 110. The third source gas may be injected into the process chamber together with a third carrier gas. The third carrier gas is an inert gas such as an argon (Ar) gas, a nitrogen ($N_2$) gas or a helium (He) gas.

Any gases (for example, non-absorbed source gas in the third supply gas) and/or the second by-product remaining in the process chamber are then exhausted by a third purge process after injection of the third supply gas (step S360). The third purge process may be performed using a purge gas, and the purge gas may be an inert gas such as an argon (Ar) gas, a nitrogen ($N_2$) gas or a helium (He) gas.

A cyclic process including the steps S310 to S360 may be repeatedly performed until the phase change material layer 110 has a desired thickness. If the phase change material layer 110 is formed to the desired thickness, the semiconductor substrate 100 having the phase change material layer 110 is unloaded from the process chamber (step S370).

In the event that the germanium source gas contains the atomic group "—C≡N", the process gas may further comprise an auxiliary reaction gas. The auxiliary reaction gas may comprise one or more selected from the group consisting of oxygen (O), sulfur (S), selenium (Se), tellurium (Te) and polonium (Po). The auxiliary reaction gas may react with the atomic group "—C≡N" to convert into one of "—N=C=O", "—N=C=S", "—N=C=Se", "—N=C=Te" and "—N=C=Po". Accordingly, the germanium source gas may comprise one of "—N=C=O", "—N=C=S", "—N=C=Se", "—N=C=Te" and "—N=C=Po". The auxiliary reaction gas may be simultaneously injected with the supply gas containing the germanium source gas. For example, if the third source gas is the germanium source gas, the third supply gas containing the third source gas may be simultaneously injected with the auxiliary reaction gas.

When the phase change material layer 110 is doped with impurities, the process gas may further comprise an impurity gas which contains one or more selected from the group consisting of nitrogen (N), oxygen (O), bismuth (Bi), stannum (Sn), boron (B) and silicon (Si). The impurity gas and the supply gases may be sequentially injected. Alternatively, the impurity gas may be simultaneously injected with one of the first to third supply gases. The impurity gas may include one or more selected from the group consisting of a hydrogen (H) gas, an ammonia ($NH_3$) gas, a $N_2H_4$ gas, a silane ($SiH_4$) gas, a diborane ($B_2H_6$) gas, an oxygen ($O_2$) gas, an ozone ($O_3$) gas and a water ($H_2O$) vapor gas.

In the aforementioned ALD process, the supply gases may comprise only the first and second supply gases. In this case, one of the first and second supply gases may comprise two of the first, second and third source gases, and the other may comprise a remaining source gas. When the supply gases comprise only the first and second supply gases as described above, steps S350 and S360 may be omitted.

The purge gases used in the first to third purge processes may be the same gas. In this case, the purge gas may be continuously injected into the process chamber during the ALD process. Specifically, the purge gas may be continuously injected from the injection step of the first supply gas (S310) to the third purge process step (S360). In this case, evacuation of the process chamber may be controlled so that the pressure inside the process chamber maintains uniformity.

The process temperature may be about 25° C. to 330° C. during the ALD process. In particular, the process temperature may be 300° C. or the lower. Further, the evacuation of the process chamber may be controlled to have a process pressure of about 1 Torr to about 5 Torr during the ALD process.

Figure 4:
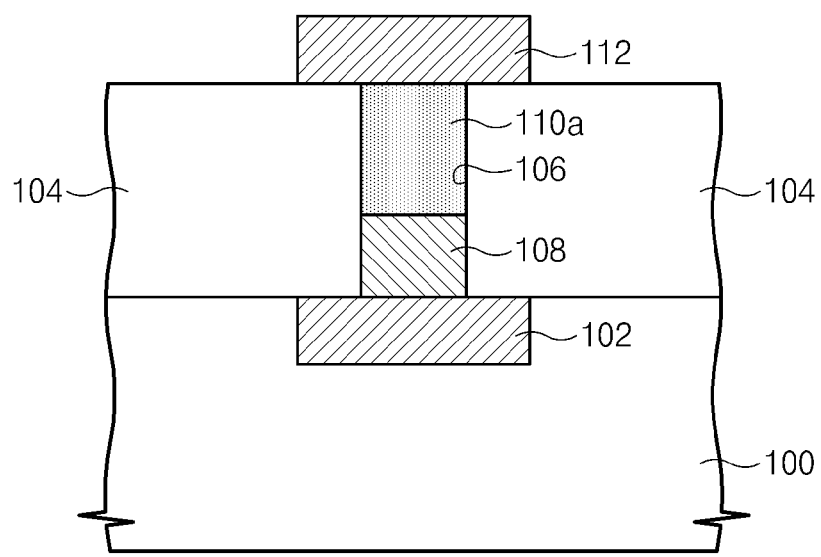

Referring to FIG. 4, the phase change material layer 110 may be planarized until a top surface of the interlayer insulating layer 104 is exposed. As a result, a phase change material pattern 110*a* is formed in the hole 106. That is, the phase change material pattern 110*a* may be formed to have a confined structure filling the upper portion of the hole 106.

A second conductive layer is formed on the interlayer insulating layer 104 and the phase change material pattern 110*a*, and the second conductive layer is patterned to form an upper conductive pattern 112 which is in contact with a top surface of the phase change material pattern 110*a*. That is, the upper conductive pattern 112 may be formed to cover the top surface of the phase change material pattern 110*a*. The upper conductive pattern 112 may, for example, be formed of one or more selected from the group consisting of doped silicon, titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and tantalum oxynitride (TaON).

According to the aforementioned embodiments, the germanium source gas may comprise at least one atomic group selected from the group consisting of "—N=C=O", "—N=C=S", "—N=C=Se", "—N=C=Te", "—N=C=Po" and "—C≡N", and the germanium source gas may be readily decomposed at a low temperature of about 330° C. or the less. Thus, volatility of the phase change material layer 110 can be minimized during formation of the phase change material layer. As a result, the phase change material layer 110 may be formed to have a continuous and uniform film quality.

Figure 7A:
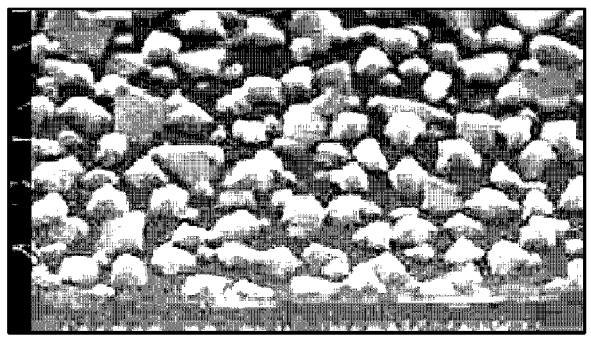
FIG. 7A is a scanning electron microscopy (SEM) image of a phase change material layer formed according to a conventional art.
Figure 7B:
FIG. 7B is a scanning electron microscopy (SEM) image of a phase change material layer formed according to an embodiment of the present invention.

FIG. 7A is a scanning electron microscopy (SEM) image of a first GST layer formed according to a conventional art, and FIG. 7B is a SEM image of a second GST layer formed according to an embodiment of the present invention.

Referring to FIGS. 7A and 7B, the first GST layer shown in FIG. 7A was formed using Ge(allyl)$_4$, which is well-known in the art as a germanium source material. In more detail, the first GST layer was formed using a first CVD process that employs Ge(allyl)$_4$, Sb(C$_3$H$_7$)$_3$ and Te(C$_4$H$_9$)$_2$ as source materials. The first CVD process was performed at a process temperature of 350° C. and under a process pressure of 2 Torr.

In contrast with the first GST layer, the second GST layer shown in FIG. 7B was formed using a second CVD process that employs iso-cyano-germane (H$_3$GeNCO), Sb(C$_3$H$_7$)$_3$ and Te(C$_4$H$_9$)$_2$ as source materials. The second CVD process was performed at a temperature of 300° C. and under a process pressure of 2 Torr.

As can be seen from FIGS. 7A and 7B, the conventional GST layer exhibited a discontinuous and non-uniform configuration. It can be understood that this is because the germanium source material (Ge(allyl)4) is not sufficiently decomposed at the process temperature of 350° C. to thereby cause a lack of germanium composition in the conventional GST layer. In contrast, the second GST layer according to the invention exhibited favorable morphology in terms of uniformity and continuity as compared to the first GST layer. It would be understood that this is because the germanium source material (H$_3$GeNCO) is fully or substantially decomposed even at a low temperature of 300° C., thereby increasing the germanium composition in the GST layer. In fact, the iso-cyano-germane (H$_3$GeNCO) began to decompose at a temperature of about 200° C. to 220° C. As a result, the GST layer according to the invention exhibited a favorable configuration. Further, iso-cyano-germane (H$_3$GeNCO) has a low decomposition temperature. Thus, the GST layer formed according to embodiments of the invention may exhibit favorable phase change characteristics as compared to the conventional GST layer.

Meanwhile, a third CVD process was carried out to form another conventional GST layer. The third CVD process was performed at a temperature of 400° C. using the same germanium source material as the first CVD process. However, the third CVD process did not provide any normal GST layer. It can be understood that this is due to the volatility of the GST layer at a high temperature of about 400° C.

According to the embodiments described above, a phase change material layer is formed using a process gas including a germanium source gas, and the germanium source gas comprises at least one atomic group selected from the group consisting of "—N=C=O", "—N=C=S", "—N=C=Se", "—N=C=Te", "—N=C=Po" and "—C≡N". The atomic groups "—N=C=O", "—N=C=S", "—N=C=Se", "—N=C=Te", "—N=C=Po" and "—C≡N" exhibit high reactivity to have a low decomposition temperature. As a result, in the event that the germanium source gas containing at least one of the atomic groups "—N=C=O", "—N=C=S", "—N=C=Se", "—N=C=Te", "—N=C=Po" and "—C≡N" is used in formation of the phase change material layer, the volatility of the phase change material layer such as a GST layer can be minimized to form a GST layer having continuous and uniform characteristics.

What is claimed is:

1. A method of forming a semiconductor device, the method comprising:
   forming a phase change material layer on a semiconductor substrate using a deposition process that employs a process gas,
   wherein the process gas comprises a germanium source gas, and the germanium source gas comprises at least one atomic group selected from the group consisting of "—N=C=O", "—N=C=S", "—N=C=Se", "—N=C=Te", "—N=C=Po" and "—C≡N".

2. The method of claim 1, wherein the germanium source gas has a chemical formula $X^1X^2X^3GeY$,
   where, each of "$X^1$", "$X^2$" and "$X^3$" is independently one of a saturated alkyl group ($C_nH_{2n+1}$; where, $0 \leq n \leq 10$), an olefinic alkyl group ($C_nH_{2n-}$; where, $1 \leq n \leq 12$), an acetylenic alkyl group ($C_nH_{2n-3}$; where, $2 \leq n \leq 13$), an allenic alkyl group (—CH=C=CH2), —NR$^1$R$^2$ (where, "R$^1$" and "R$^2$" are alkyl groups), —N$_3$, —N=C=O, —N=C=S, —N=C=Se, —N=C=Te, —N=C=Po, —C≡N and a combination thereof, and
   where "Y" includes at least one selected from the group consisting of "—N=C=O", "—N=C=S", "—N=C=Se", "—N=C=Te", "—N=C=Po" and "—C≡N".

3. The method of claim 2, wherein each of "R$^1$" and "R$^2$" is independently one of a saturated alkyl group ($C_nH_{2n+1}$; where, $0 \leq n \leq 10$), an olefinic alkyl group ($C_nH_{2n-1}$; where, $1 \leq n \leq 12$), an acetylenic alkyl group ($C_nH_{2n-3}$; where, $2 \leq n \leq 13$) and an allenic alkyl group (—CH=C=CH2).

4. The method of claim 2, wherein at least two of "$X^1$", "$X^2$" and "$X^3$" are bound by chemical bond.

5. The method of claim 1, wherein the germanium source gas comprises an atomic group "—C≡N", and wherein the process gas further comprises an auxiliary reaction gas containing at least one selected from the group consisting of oxygen (O), sulfur (S), selenium (Se), tellurium (Te) and polonium (Po).

6. The method of claim 1, wherein the deposition process is performed at a process temperature of substantially about 25° C. to about 330° C.

7. The method of claim 1, wherein before forming the phase change material layer, the method further comprises:
   forming an interlayer insulating layer on the semiconductor substrate; and
   patterning the interlayer insulating layer to form a hole, wherein the phase change material layer is formed to fill at least a portion of the hole.

8. The method of claim 7, further comprising forming a lower conductive pattern that fills a lower portion of the hole, wherein the phase change material layer is formed to fill the hole and on the lower conductive pattern.

9. The method of claim 7 further comprises:

planarizing the phase change material layer until the interlayer insulating layer is exposed, thereby forming a phase change material pattern in the hole; and forming an upper conductive pattern on the interlayer insulating layer, the upper conductive pattern being formed to cover a top surface of the phase change material pattern.

10. The method of claim 1, wherein the phase change material layer is formed of at least one selected from the group consisting of Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge,Sn)—Sb—Te, Ge—Sb—(Se,Te), Ge—Sb—In, Ge—Sb—Te—S and any of these compounds containing impurities therein, and wherein the impurities are at least one selected from the group of consisting of nitrogen (N), oxygen (O), bismuth (Bi), stannum (Sn), boron (B) and silicon (Si).

11. The method of claim 10, wherein forming the phase change material layer comprises:

loading the semiconductor substrate into a process chamber;

injecting plural kinds of source gases into the process chamber to form a phase change material layer on the semiconductor substrate; and unloading the semiconductor substrate having the phase change material layer from the process chamber, wherein the process gas comprises the plural kinds of source gases, and one of the source gases is the germanium source gas.

12. The method of claim 11, wherein the plural kinds of source gases are simultaneously injected into the process chamber to form the phase change material layer.

13. The method of claim 12, wherein the phase change material layer is formed using a chemical vapor deposition (CVD) process.

14. The method of claim 12, wherein the process gas further comprises an impurity gas including at least one selected from the group consisting of nitrogen (N), oxygen (O), bismuth (Bi), stannum (Sn), boron (B) and silicon (Si), and wherein the impurity gas and the plural kinds of source gases are simultaneously injected into the process chamber.

15. The method of claim 11, comprising sequentially injecting a plurality of supply gases into the process chamber to form the phase change material layer, wherein each of the supply gases comprises at least one of the plural kinds of source gases.

16. The method of claim 15, wherein the phase change material layer is formed using an atomic layer deposition (ALD) process.

17. The method of claim 15, wherein the process gas further comprises an impurity gas including at least one selected from the group consisting of nitrogen (N), oxygen (O), bismuth (Bi), stannum (Sn), boron (B) and silicon (Si), and wherein the impurity gas and the plurality of supply gases are sequentially injected into the process chamber.

18. The method of claim 15, wherein the process gas further comprises an impurity gas including at least one selected form the group consisting of nitrogen (N), oxygen (O), bismuth (Bi), stannum (Sn), boron (B) and silicon (Si), and wherein the impurity gas is simultaneously injected with at least one of the supply gases.

19. The method of claim 15, further comprises purging the process chamber after injection of each of the supply gases.

20. The method of claim 10, wherein the germanium source gas is injected into the process chamber together with a carrier gas, and wherein the carrier gas is an inert gas.

* * * * *